US007477452B2

(12) United States Patent
Tsuruma

(10) Patent No.: US 7,477,452 B2
(45) Date of Patent: Jan. 13, 2009

(54) MICRO LENS ARRAY, OPTICAL MEMBER AND METHOD OF PRODUCING MICRO LENS ARRAY

(75) Inventor: Isao Tsuruma, Kanagawa-ken (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 11/213,838

(22) Filed: Aug. 30, 2005

(65) Prior Publication Data

US 2006/0056034 A1    Mar. 16, 2006

(30) Foreign Application Priority Data

Sep. 2, 2004   (JP) .............................. 2004-255359

(51) Int. Cl.
  *G02B 27/10* (2006.01)
  *B29D 11/00* (2006.01)

(52) U.S. Cl. ........................................ 359/626; 264/1.1

(58) Field of Classification Search ......... 359/618–621, 359/626, 443, 454–455; 264/1.1, 1.32, 1.7, 264/2.7
  See application file for complete search history.

(56) References Cited

U.S. PATENT DOCUMENTS

| 5,426,531 A | * | 6/1995 | Tsukagoshi | ................. 359/457 |
| 5,434,706 A | * | 7/1995 | Mitani et al. | ................. 359/457 |
| 5,590,943 A | * | 1/1997 | Yoshida et al. | ................. 353/74 |
| 6,384,970 B1 | * | 5/2002 | Abe et al. | ..................... 359/455 |
| 6,628,460 B1 | * | 9/2003 | Ookawa et al. | ............. 359/455 |
| 6,919,991 B2 | * | 7/2005 | Koyama | ....................... 359/619 |
| 6,982,833 B2 | * | 1/2006 | Nemoto | ...................... 359/626 |
| 2001/0028506 A1 | * | 10/2001 | Fujimoto et al. | ............ 359/622 |
| 2002/0141067 A1 | * | 10/2002 | Takakuwa et al. | ........... 359/619 |
| 2002/0176172 A1 | * | 11/2002 | Nemoto et al. | .............. 359/619 |
| 2003/0112522 A1 | * | 6/2003 | Fujimoto | ..................... 359/619 |
| 2004/0196560 A1 | * | 10/2004 | Nagasawa et al. | ........... 359/619 |
| 2005/0099695 A1 | * | 5/2005 | Takegawa et al. | ........... 359/619 |
| 2005/0162747 A1 | * | 7/2005 | Shimizu | ...................... 359/619 |
| 2006/0193054 A1 | * | 8/2006 | Chang et al. | ................. 359/626 |
| 2006/0215269 A1 | * | 9/2006 | Abe et al. | ..................... 359/619 |

FOREIGN PATENT DOCUMENTS

| JP | 6-194502 A | 7/1994 |
| JP | 7-174902 A | 7/1995 |
| JP | 8-313706 A | 11/1996 |
| JP | 10-160905 A | 6/1998 |

* cited by examiner

*Primary Examiner*—Scott J Sugarman
*Assistant Examiner*—Dawayne A Pinkney
(74) *Attorney, Agent, or Firm*—Sughrue Mion, PLLC

(57) ABSTRACT

A micro lens array includes a plurality of convex micro lenses formed on a transparent substrate in an array. The micro lenses are convex toward a surface of the substrate in a position inward of the surface of the substrate and the top of the convex surface of the micro lenses is lower than the surface of the substrate.

6 Claims, 4 Drawing Sheets

MICRO LENS ARRAY, OPTICAL MEMBER AND METHOD OF PRODUCING MICRO LENS ARRAY

BACKGROUND OF THE INVENTION

1. Field of the Invention

This invention relates to a micro lens array where a plurality of convex micro lenses are formed on a transparent substrate in an array, and an optical member using the micro lens array and to a method of producing the micro lens array.

2. Description of the Related Art

There has been known a micro lens array where a plurality of convex micro lenses which are not larger than several hundred μm in their diameter are formed on a transparent substrate in an array as disclosed in, for instance, Japanese Unexamined Patent Publication No. 6(1994)-194502. Recently, the micro lens array of this type has come to be used in various fields as an optical member for forming, for instance, a liquid crystal display or a pickup for a solid state imaging system, an optical communication, or an optical disk. Since being fine in size of the micro lenses, the micro lens array is generally produced on the basis of a semiconductor fine processing technique.

For example, there has been known a method in which a resist pattern is formed on a transparent substrate by photolithography, the resist is heated to a temperature above its softening point, to form the convex shape by surface tension, and the convex shape is transferred to the substrate by dry etching to form a micro lens as disclosed in Japanese Unexamined Patent Publication No. 6(1994)-194502.

In the micro lens array, there has been a plurality of factors which deteriorate the optical performance such as transmitted light transmitted through a flat substrate surface since the micro lens array has a flat substrate surface and curved lens surfaces, and stray light entering a micro lens from other micro lenses.

In the past, it has been conceived to cut such stray light that light-shielding film is provided on the transparent substrate in the area other than the areas where the micro lenses are formed, and there have been proposed various methods of producing a micro lens array with such light-shielding film. For example, in Japanese Unexamined Patent Publication No. 7(1995)-174902, a method where micro lenses are formed above light-shielding film by heat-melting a resin is disclosed, in Japanese Unexamined Patent Publication No. 8(1996)-313706, a method where light-shielding film is patterned on the surface of the micro lenses by photolithography is disclosed, and in Japanese Unexamined Patent Publication No. 10(1998)-160905, a method where light-shielding film is formed by plating the area other than the areas where the micro lenses are formed is disclosed.

However, in the conventional micro lens array, since the micro lenses project upward from a surface of the transparent substrate, there has been a problem that a handler's hand or a jig can be brought into contact with the lens surface to damage or stain the same. Further, when the micro lens array is bonded to another optical member, the tops of the convex micro lenses can be brought into contact with said another optical member, which deteriorates the optical properties of the system that, for instance, the portions do not function as a lens. In this case, it is necessary, for instance, to provide a spacer around the lens portion. However, this approach involves another problem that deflection is generated by a difference in stress between the light-shielding film and the substrate and the length of the optical path changes since the light-shielding film is formed on the substrate.

SUMMARY OF THE INVENTION

In view of the foregoing observations and description, the primary object of the present invention is to provide a micro lens array where the convex micro lenses are less apt to be brought into contact with another member.

Another object of the present invention is to provide a method in accordance with which the micro lens array can be produced at a high efficiency.

In accordance with the present invention, there is provided a micro lens array where a plurality of convex micro lenses are formed on a transparent substrate in an array wherein the improvement comprises that the micro lenses are convex toward a surface of the substrate in a position inward of the surface of the substrate and the top of the convex surface of the micro lenses is lower than the surface of the substrate.

It is preferred that the transparent substrate be convex in whole toward a surface by forming stress control film on the surface of the substrate.

It is further preferred that the stress control film be formed as light-shielding film. It is further preferred that the light-shielding film be provided with plating which projects in a direction parallel to the surface of the film to be opposed to the periphery of the micro lens and to narrow the effective aperture of the micro lens.

The present invention further provides an optical member using the micro lens array. The optical member comprises a micro lens array in accordance with the present invention and another transparent member having a flat surface bonded to the micro lens array wherein the improvement comprises that the surface of the substrate in which the substrate is convex and said one surface of said another transparent member are bonded.

In accordance with the present invention, there is further provided a method of producing a micro lens array of the present invention with stress control film formed on one surface of the substrate comprising the steps of forming on the transparent substrate stress control film having openings corresponding to the pattern of the micro lenses, forming a convex resin pattern corresponding to the micro lenses in shape in positions of the transparent substrate where said openings exist, and dry-etching the transparent substrate from the resin pattern side, thereby transferring the shape of the resin pattern and forming the micro lenses.

It is preferred that the stress control film be formed as light-shielding film by the use of a light-shielding material. In this case, it is further preferred that the light-shielding film be provided with plating which projects in a direction parallel to the surface of the film to be opposed to the periphery of the micro lens and to narrow the effective aperture of the micro lens after the micro lenses are formed.

In the micro lens array of this invention, since the micro lenses are convex toward a surface of the substrate in a position inward of the surface of the substrate and the top of the convex surface of the micro lenses is lower than the surface of the substrate, the operator's hand or another material is less apt to contact with the top of the micro lenses even if the operator's hand or another material is brought into contact with the surface of the substrate. When the convex micro lenses are less apt to be brought into contact with another material, the trouble that the micro lenses are damaged or stained can be avoided.

In the case where stress control film is formed on the surface of the transparent substrate and the substrate is curved in whole so that the surface is convex, when the convex surface of the substrate is bonded to another transparent member having a flat surface to produce an optical member of the present invention, the central portion of the substrate is first brought into contact with the flat surface of said another transparent member and then the contact area gradually spread toward the periphery of the substrate. Accordingly, the substrate of the micro lens array and the transparent member come to be firmly bonded to each other over the entire area without gaps therebetween, and the optical member can be uniform in the optical path from another surface of the transparent member to the tip of the micro lens.

Further, when the stress control film is formed as light-shielding film, light transmitted through the substrate outside the periphery of the micro lenses can be cut, whereby generation of stray light can be prevented. When the light-shielding film is provided with plating which projects in a direction parallel to the surface of the film to be opposed to the periphery of the micro lens and to narrow the effective aperture of the micro lens, light passing through the part near the periphery of the micro lenses which is relatively apt to be deformed in shape is not used, whereby the optical characteristics of the micro lens array can be improved.

The micro lens array with the stress control film described above can be efficiently produced by the method of the present invention described above.

Further, in the method of the present invention, the length of the optical path from the surface of the substrate to the tip of the micro lenses can be easily set to a desired value by controlling the etching depth upon dry-etching.

DESCRIPTION OF THE PREFERRED EMBODIMENTS

Figure 1A:
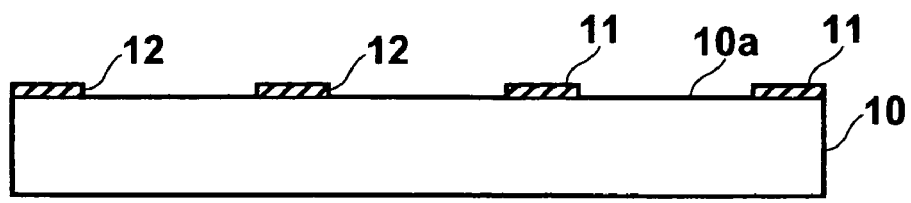
FIGS. 1A to 1D are schematic views showing steps of producing a micro lens array in accordance with a first embodiment of the invention.

As shown in FIG. 1A, a light-shielding metal is first sputtered on a surface 10a of a transparent substrate 10, which may comprise, for instance, $SiO_2$ glass, to form metal film 11 and a number of openings 12 are formed in the metal film 11 by usual photolithography. The metal film 11 is formed, for instance, by Cr, and the thickness thereof is about 50 to 200 nm. Further, the openings 12 are formed in the metal film 11 so that the openings 12 correspond to the pattern of a plurality of micro lenses to be produced in an array.

Figure 1B:
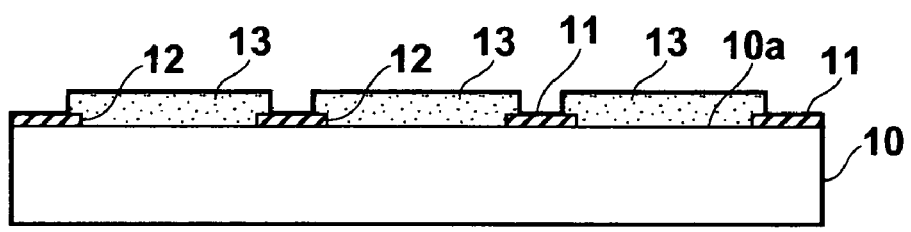

Then positive photoresist 13 is applied on the metal film 11 and photoresist 13 is remained in a shape corresponding to the shape of the micro lens by exposing the photoresist 13 to light through a photo mask having a pattern of openings which determine the shape of lenses and developing the same as shown FIG. 1B.

The photoresist 13 thus remained is larger than the opening 12 of the metal film 11. Further, by attaching an alignment mark on the metal film 11 in a position other than the areas where the micro lenses are formed, and using the alignment mark upon exposure of the resist, the exposure pattern can be highly accurately located with respect to the openings 12.

Figure 1C:
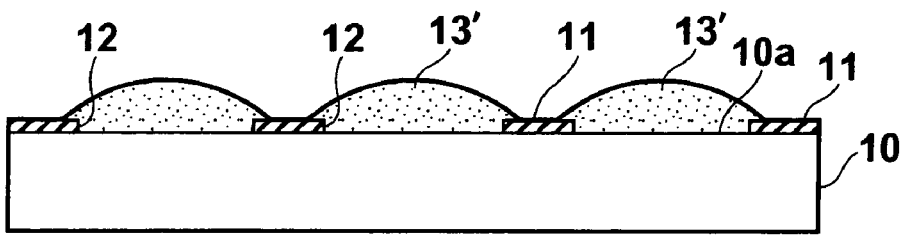

Then the substrate 10 is heated to the softening point of the photoresist 13 (130 to 150° C.) to form a pattern of convex resin 13' which is formed by photoresist as shown in FIG. 1C. Each convex resin 13' corresponds in shape to the micro lens to be made.

Figure 1D:
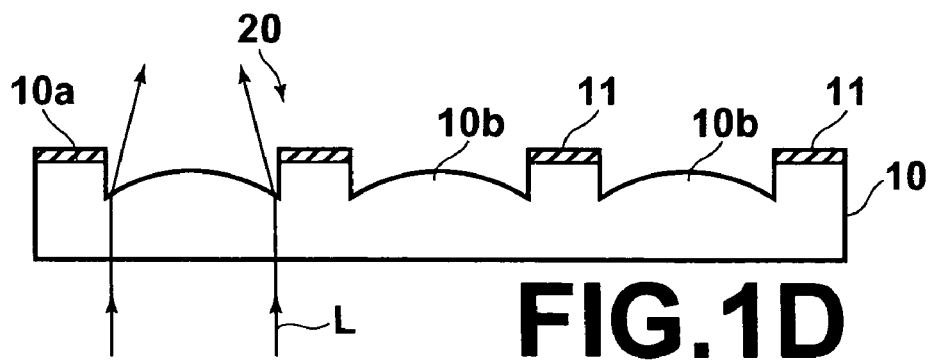

Then the transparent substrate 10 is etched, in dry etching using a fluorine series gas such as $CF_4$, $CHF_3$, $C_2F_6$ or $SF_6$ from the side of the pattern of convex resin 13' to transfer the shape of each convex resin 13' to the transparent substrate 10, whereby a number of micro lenses 10b are formed in an array on the transparent substrate 10 as shown in FIG. 1D.

At this time, oxygen gas is not added so that the metal film 11 of Cr is not etched. Thus, the shape of lens is transferred only just below the opening 12 of the metal film 11. It is preferred that a dry etching in which the biases can be independently controlled by high density plasma such as ICP or ECR be selected.

With this method, a desired lens shape can be formed on the transparent substrate 10 by controlling the etching rates of the pattern of convex resin 13' and the transparent substrate 10 by suitably setting the etching conditions. Further, by changing the etching conditions during etching to change with time the difference in etching rate between the pattern of convex resin 13' and the transparent substrate 10, aspheric lenses can be made.

If necessary, antireflection coating is subsequently provided on each side of the transparent substrate 10 and a micro lens array 20 of this embodiment is finished. The micro lens array 20 of this embodiment is provided with metal film 11 formed to circumscribe each of the micro lenses 10b. The metal film 11 functions as a light-shielding film which cuts light transmitted through the transparent substrate 10 in a position other than the areas where the micro lenses 10b are formed. Though this is a description when light L to be condensed travels through the micro lens array 20 upward from below as seen in FIGS. 1A to 1D, the metal film 11 exhibits a similar light shielding effect also when light travels through the micro lens array 20 downward.

In the micro lens array 20 of this embodiment, since the micro lenses 10b are convex toward the surface 10a of the transparent substrate 10 in a position inward of the surface 10a of the substrate 10 and the top of the convex surface of the micro lenses 10b is lower than the surface 10a of the substrate 10, the operator's hand or another material is less apt to contact with the top of the micro lenses 10b even if the operator's hand or another material is brought into contact with the surface 10a of the substrate 10 (more specifically, the metal film 11). When the convex micro lenses 10b are less apt to be brought into contact with another material, the trouble that the micro lenses 10b are damaged or stained can be avoided.

Though being formed by softening the photoresist 13 and forming a curved surface by surface tension in this embodiment, the pattern of resin 13' in a lens shape may be formed by other known methods. For example, a method where photolithography by the use of a gray scale mask is used or a method where the lens shape is transferred by resin molding may be used. Further, it is possible to use a method where a resist layer is formed on a surface of the transparent substrate 10 in a predetermined pattern and a curved surface is formed by exposing the resist layer to a solvent vapor atmosphere to absorb the solvent and to be dissolved. In accordance with this method, the pattern of resin in a shape of a lens can be formed under a room temperature without heat treatment.

The substrate may be formed by other materials so long as it is transparent. For example, a substrate of optical glass or transparent resin maybe used. The metal film 11 as light-shielding film may be of metal or alloy other than Cr such as Al, Ni, Ti, Mo, Ta or W or maybe formed by laminated film. Further in order to obtain optimal dry-etching conditions, the etching conditions such as the kind of etching gas may be suitably changed according to the kind of the substrate and the kind of the light-shielding film.

Figure 2:
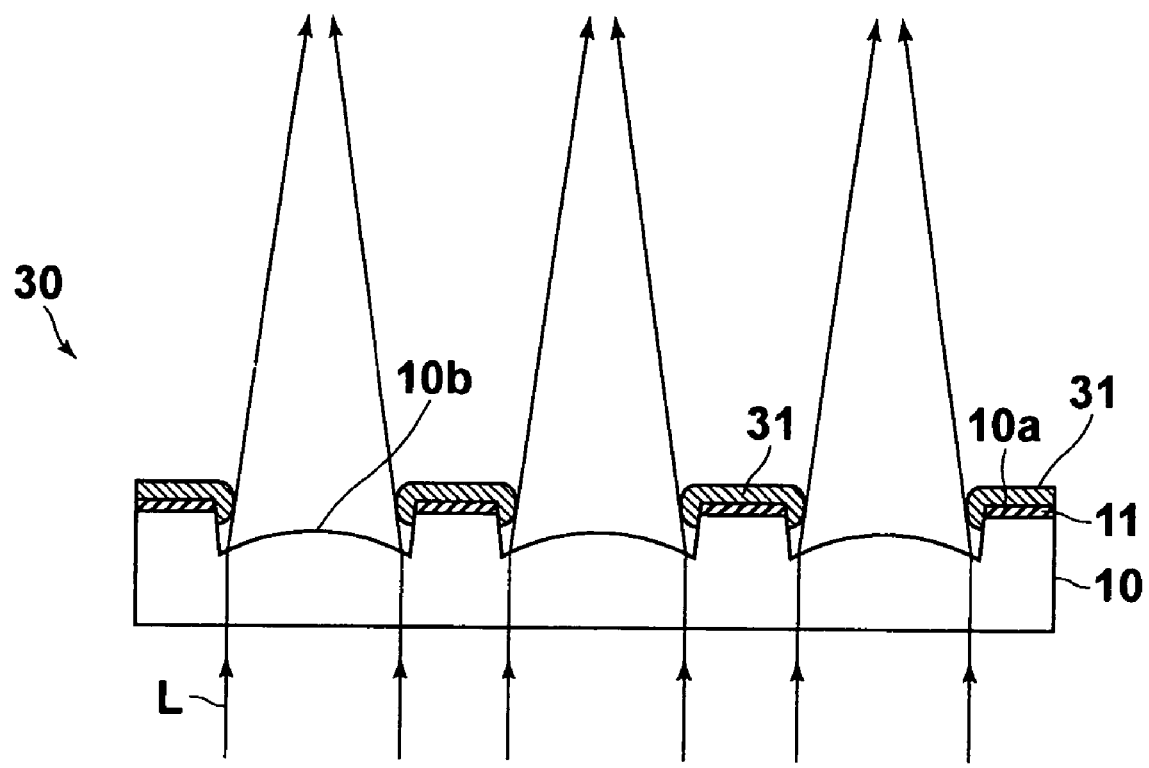
FIG. 2 is a schematic side view showing a micro lens array in accordance with a second embodiment of the invention.

A micro lens array in accordance with a second embodiment of the present invention will be described, hereinbelow. FIG. 2 shows in brief the shape of the micro lens array 30 in accordance with a second embodiment of the present invention. In FIG. 2, the elements analogous to those shown in FIG. 1 are given the same reference numerals and will not be described unless necessary. (the same in the following drawings)

In the micro lens array 30, after the micro lens array the same as that in accordance with the first embodiment described above is formed, the metal film 11 which functions as a light-shielding film is further provided with metal plating 31. With this arrangement, the thickness of the metal film 11 is increased and the metal plating 31 projects in a direction substantially parallel to the surface of the film 11 to narrow the effective aperture of the micro lenses 10b. With this embodiment, light passing through the part near the periphery of the micro lenses 10b which is relatively apt to be deformed in shape is not used, whereby the optical characteristics of the micro lens array 30 can be improved. Further, since the thickness of the light-shielding film is increased, the light-shielding effect can be improved.

Figure 3A:
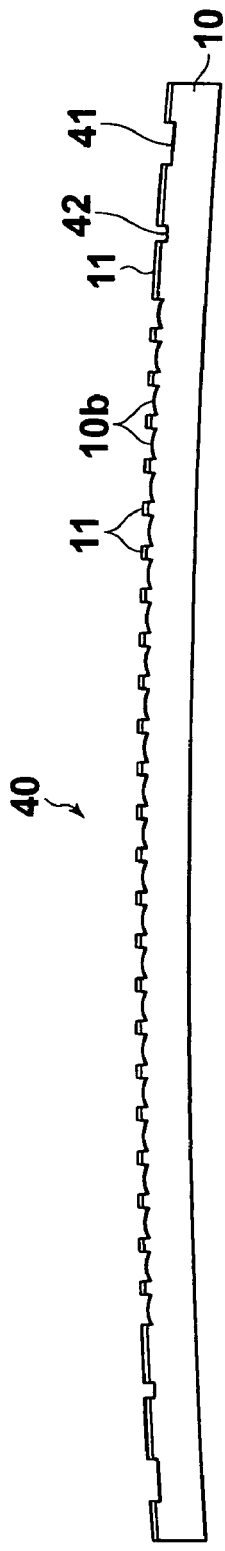
FIGS. 3A to 3C are schematic views showing steps of producing an optical member in accordance with a third embodiment of the invention.
Figure 3B:
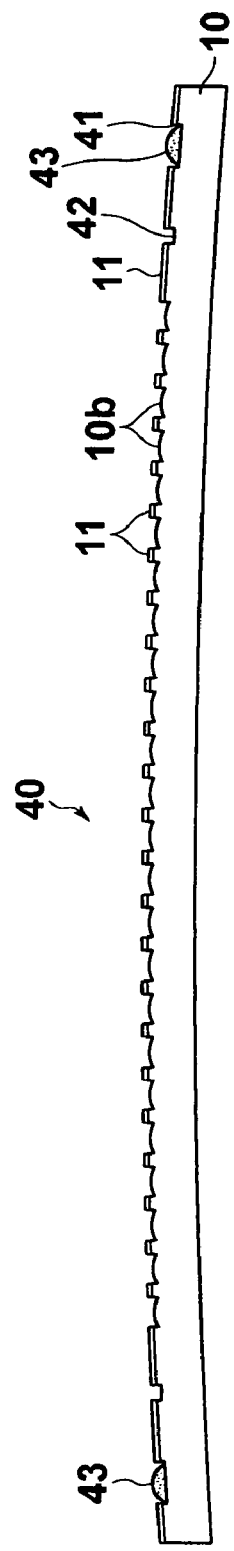
Figure 3C:
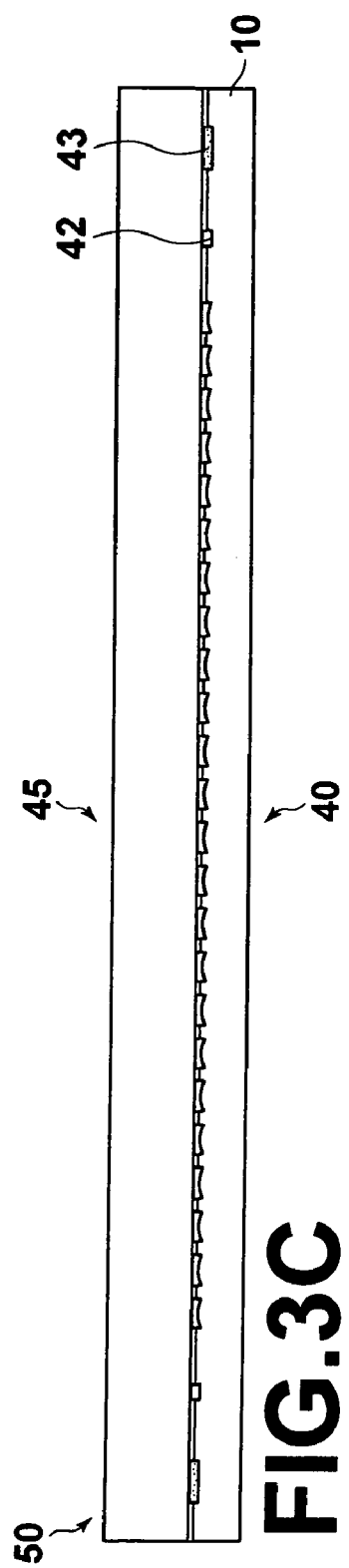
Figure 4:
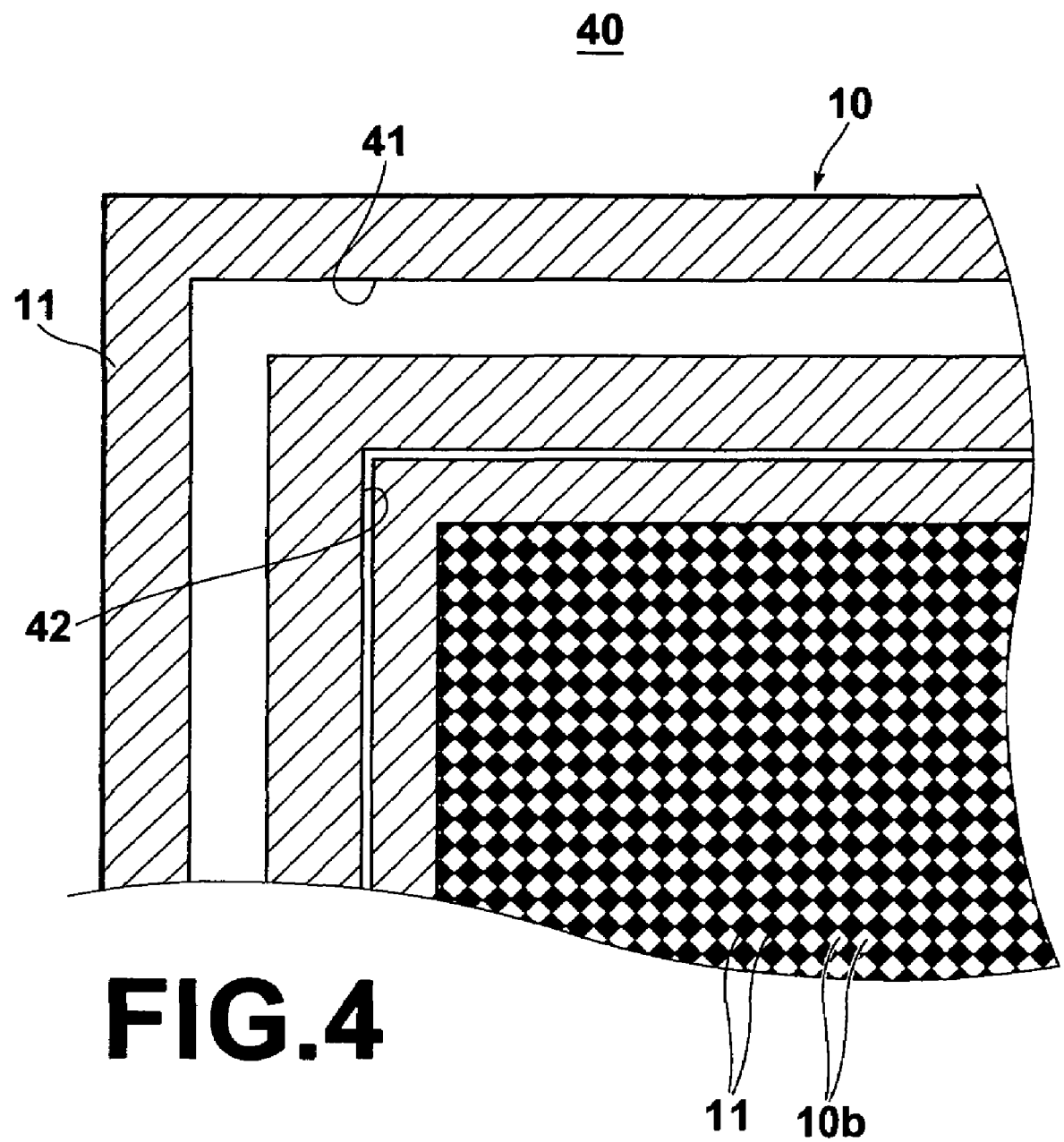
FIG. 4 is a fragmentary plan view showing the micro lens array employed in the optical member shown in FIGS. 3A to 3C.

An optical member in accordance with the third embodiment of the present invention will be described, hereinbelow. FIGS. 3A to 3C show the steps of producing the optical member 50 of the third embodiment. A micro lens array 40 which is the same in basic structure as the micro lens array 20 in the first embodiment is first prepared as shown in FIG. 3A. As shown in FIG. 4, the micro lens array 40 comprises a number of micro lenses 10b formed on a rectangular transparent substrate 10 in the manner described above. The surface of the transparent substrate 10 on which the metal film 11 is formed is formed, for instance, by etching with an annular rectangular adhesive groove 41 in a position near its outer periphery, and an annular rectangular adhesive squeeze-out preventing groove 42 formed inside the annular rectangular adhesive groove 41.

In the micro lens array 40, the metal film 11 which functions as light-shielding film is formed to have compression stress so that the transparent substrate 10 is curved in whole to be slightly convex toward the surface on which the metal film 11 is formed. For example, the micro lens array 40 can be so structured, when the metal film 11 is formed by sputtering, by controlling the temperature, the RF frequency or the power upon formation of the film, or when the metal film 11 is formed by plating, by adjusting the current density or the additives. As can be understood from the description above, the metal film 11 also functions as stress control film in this particular embodiment.

Then, an ultraviolet-curing resin 43 is applied in a suitable amount in the adhesive groove 41 with a dispenser as shown in FIG. 3B, and a transparent member 45 in the form of a plane-parallel plate is placed on the transparent substrate 10 as shown in FIG. 3C. As the transparent member 45, a plate which is simply bonded to the micro lens array 40 to reinforce the same or a plate having pin holes which reduces the effective aperture of the micro lens 10b may be used.

When the transparent member 45 of the latter type is employed, for example, an alignment mark formed on the micro lens array 40 in a position other than the areas where the micro lenses 10b are formed is brought into alignment with an alignment mark formed on the transparent member in a position other than the areas where the pin holes are formed to roughly align them, and they can be finally finely aligned by introducing parallel light from the side of the micro lens array 40 and finely aligning them so that the intensity of light emitted from the pin holes is maximized.

Then ultraviolet rays are projected form the side of the micro lens array 40 to cure the ultraviolet-curing resin 43 to bond the transparent substrate 10 and the transparent member 45. The ultraviolet-curing resin 43 squeezing out at this time flows into the adhesive squeeze-out preventing groove 42, and accordingly does not affect the area of the micro lenses 10b. Thus, the optical member 50 of this embodiment is made.

When the transparent substrate 10 is curved in whole to be slightly convex toward the surface on which the metal film 11 is formed, the central portion of the substrate is first brought into contact with a surface of the transparent member 45 and then the contact area gradually spread toward the periphery of the substrate when the micro lens array 40 is bonded to the transparent member 45. Accordingly, the substrate 10 of the micro lens array 40 and the transparent member 45 come to be firmly bonded to each other over the entire area without gaps therebetween, and the optical member can be uniform in the optical path from another surface of the transparent member 45 (the upper surface in FIGS. 3A to 3C) to the tip of the micro lens 10b.

In place of bonding a transparent member 45 having pin holes to the transparent substrate 10, a transparent plate is first bonded to the transparent substrate 10 and pin holes may be formed in self-alignment by a method using the micro lenses as disclosed in Japanese Unexamined Patent Publication No. 11(1999)-344602.

Further, as the micro lens array 40, those which are the same in basic structure as the micro lens array 30 in the second embodiment may be used in addition to those which are the same in basic structure as the micro lens array 20 in the first embodiment.

Though the embodiments described above have metal film 11 which functions as light-shielding film and stress control film, the micro lens array of this embodiment need not have such film. Also in this case, the effect of preventing the micro lenses from being damaged or stained can be obtained.

What is claimed is:

1. A micro lens array comprising a plurality of convex micro lenses that are formed on a transparent substrate in an array, wherein:

the micro lenses are convex toward a surface of the substrate in a position inward of the surface of the substrate, the top of the convex surface of the micro lenses is lower than the surface of the substrate, the top of the convex surface of each micro lens is lower than portions of the surface of the substrate which immediately adjoin the micro lens, a light-shielding film is formed on the surface of the substrate, and a plating is formed on a surface of the light-shielding film, wherein the plating outwardly projects in a direction parallel to the surface of the film to be opposed to the periphery of the micro lens and to narrow the effective aperture of the micro lens.

2. A micro lens array comprising a plurality of convex micro lenses that are formed on a transparent substrate in an array, wherein:
- the micro lenses are convex toward a surface of the substrate in a position inward of the surface of the substrate,
- the top of the convex surface of the micro lenses is lower than the surface of the substrate,
- the top of the convex surface of each micro lens is lower than portions of the surface of the substrate which immediately adjoin the micro lens,
- the transparent substrate is convex in whole toward the surface of the substrate by forming a stress control film on a surface of the substrate,
- the stress control film is formed as light-shielding film, and
- a plating is formed on a surface of the light-shielding film, wherein the plating outwardly projects in a direction parallel to the surface of the film to be opposed to the periphery of the micro lens and to narrow the effective aperture of the micro lens.

3. An optical member comprising a micro lens array defined in claim 2 and another transparent member having a flat surface bonded to the micro lens array, wherein the surface of the substrate in which the substrate is convex and said flat surface of said another transparent member are bonded.

4. A method of producing a micro lens array defined in claim 2, the method comprising:
- forming on the transparent substrate a stress control film having openings corresponding to the pattern of the micro lenses,
- forming a convex resin pattern corresponding to the micro lenses in shape in positions of the transparent substrate where said openings exist, and
- dry-etching the transparent substrate from the resin pattern side, thereby transferring the shape of the resin pattern and forming the micro lenses.

5. A method as defined claim 4 in which the stress control film is formed as light-shielding film by the use of a light-shielding material.

6. A method as defined claim 5 in which a plating is formed on a surface of the light-shielding film, wherein the plating outwardly projects in a direction parallel to the surface of the film to be opposed to the periphery of the micro lens and to narrow the effective aperture of the micro lens after the micro lenses are formed.

* * * * *